United States Patent
Zhang et al.

(10) Patent No.: US 10,075,573 B2
(45) Date of Patent: Sep. 11, 2018

(54) FLEXIBLE DISPLAY DEVICE WITH REDUCED BEND STRESS WIRES

(71) Applicant: LG Display Co., Ltd., Seoul (KR)

(72) Inventors: Zhen Zhang, Cupertino, CA (US); Paul Stephen Drzaic, Cupertino, CA (US); Seyeoul Kwon, Seoul (KR); Sangcheon Youn, Seoul (KR); Heeseok Yang, Seoul (KR); Chanwoo Lee, Seoul (KR); Soyoung Jo, Seoul (KR); Anna Ha, Seoul (KR); Dongyoon Kim, Seoul (KR); Saemleenuri Lee, Seoul (KR); Yoondong Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/509,835

(22) PCT Filed: Sep. 29, 2014

(86) PCT No.: PCT/US2014/058086
§ 371 (c)(1),
(2) Date: Mar. 8, 2017

(87) PCT Pub. No.: WO2016/053246
PCT Pub. Date: Apr. 7, 2016

(65) Prior Publication Data
US 2017/0302772 A1    Oct. 19, 2017

(51) Int. Cl.
| | |
|---|---|
| H01L 23/52 | (2006.01) |
| H04M 1/02 | (2006.01) |
| G09F 9/30 | (2006.01) |
| G06F 1/16 | (2006.01) |
| H01L 51/56 | (2006.01) |

(52) U.S. Cl.
CPC ........ *H04M 1/0268* (2013.01); *G06F 1/1652* (2013.01); *G09F 9/301* (2013.01); *H01L 51/56* (2013.01)

(58) Field of Classification Search
CPC ... H01L 24/50; H01L 23/528; H01L 23/5386; H01L 23/52; G09F 9/301
See application file for complete search history.

(56) References Cited

U.S. PATENT DOCUMENTS

| | | |
|---|---|---|
| 5,931,764 A | 8/1999 | Maghribi et al. |
| 6,479,762 B2 | 11/2002 | Kusaka |
| 7,197,818 B2 | 4/2007 | Cannon et al. |
| 7,337,012 B2 | 2/2008 | Maghribi et al. |
| 7,820,497 B2 | 10/2010 | Gnade |

(Continued)

OTHER PUBLICATIONS

PCT International Search Report, PCT/US2014/058086, dated Dec. 16, 2014, 2 Pages.

(Continued)

*Primary Examiner* — Hoai V Pham
(74) *Attorney, Agent, or Firm* — Fenwick & West LLP

(57) ABSTRACT

A conductive trace design is described that minimizes the possibility of crack initiation and propagation in conductive traces during bending. The conductive trace design has a winding trace pattern that is more resistant to the formation of cracks at high stress points in the conductive traces. The conductive trace design includes a cap that helps ensure electrical connection of the conductive trace even though one or more cracks may begin to form in the conductive portion of the conductive trace.

20 Claims, 13 Drawing Sheets

(56) References Cited

U.S. PATENT DOCUMENTS

| | | |
|---|---|---|
| 2006/0231288 A1 | 10/2006 | Vanfleteren et al. |
| 2011/0057873 A1 | 3/2011 | Geissler et al. |
| 2012/0051005 A1 | 3/2012 | Vanfleteren et al. |
| 2012/0062447 A1 | 3/2012 | Tseng et al. |
| 2012/0218219 A1 | 8/2012 | Rappoport et al. |
| 2014/0217373 A1 | 8/2014 | Youn et al. |
| 2014/0232956 A1 | 8/2014 | Kwon et al. |

OTHER PUBLICATIONS

PCT Written Opinion, PCT/US2014/058086, dated Dec. 16, 2014, 5 Pages.

Extended European Search Report for European Patent Application No. EP 14903089.2, dated Jan. 3, 2018, 9 Pages.

FLEXIBLE DISPLAY DEVICE WITH REDUCED BEND STRESS WIRES

BACKGROUND

Technical Field

This relates generally to electronic devices, and more particularly, to electronic devices with a flexible display.

Description of the Related Art

Electronic devices often include displays. For example, cellular telephones and portable computers include displays for presenting information to a user. Many electronic devices are now being built on flexible substrates rather than rigid circuit boards or glass. This allows electronic devices to be flexed or bent to some degree. Like conventional non-flexible devices, flexible electronic devices include conductive traces, typically made of metal, that are used to propagate signals within the electronic devices. However, the conventional designs of conductive traces are prone to cracking and/or delamination over repeated bending of the electronic devices, resulting in reduced performance and/or reliability.

SUMMARY

The embodiments herein describe a winding conductive trace design that is resistant to cracking during bending and stretching stresses. The winding conductive trace design may be incorporated in any flexible electronic device such as a flexible display device, or in any electronic device that may not necessarily be flexible. In some embodiments, a winding conductive trace includes a cap located in a low stress region of the winding conductive trace. The width of a metal trace line located in the regions of the winding conductive trace that include caps is wider than the width of the metal trace line located in other regions of the winding conductive trace that lack the caps. The cap helps ensure electrical connection of the metal trace line even though one or more cracks may begin to form in the metal trace line.

In one embodiment, an apparatus comprises a flexible substrate and a winding conductive trace formed over the flexible substrate. The winding conductive trace includes a plurality of alternating crests and troughs. Each crest and each trough has a first edge (e.g., an outer edge) and a second edge (e.g., an inner edge) positioned opposite the first edge. A first portion of the winding conductive trace located between each alternating crest and trough is smaller in width than a second portion of the winding conductive trace between the first edge and the second edge of each of the crests and troughs.

In one embodiment, a winding conductive trace splits into multiple sub-traces which converge back into a single winding conductive trace at certain intervals to prevent or minimize severance of interconnections by cracks in the winding conductive trace. An apparatus including multiple sub-traces comprises a flexible substrate and a winding conductive trace formed over the flexible substrate. The winding conductive trace includes a first sub-trace and a second sub-trace that is symmetric to the first sub-trace. The first sub-trace and the second sub-trace are disposed in a mirrored shape and each includes a plurality of alternating crests and troughs that each has a first edge (e.g., an outer edge) and a second edge (e.g., an inner edge) positioned opposite the first edge. The first sub-trace and the second sub-trace split from the winding conductive trace and merge back together at a plurality of joints where each joint is located at a trough of the first sub-trace and a crest of the second sub-trace. A first portion of each first sub-trace and each second sub-trace located between each alternating crest and trough is smaller in width than a second portion of each first sub-trace and each second sub-trace between the first edge and the second edge of each of the crests and troughs.

DETAILED DESCRIPTION

Flexible Display Device

Figure 1A:
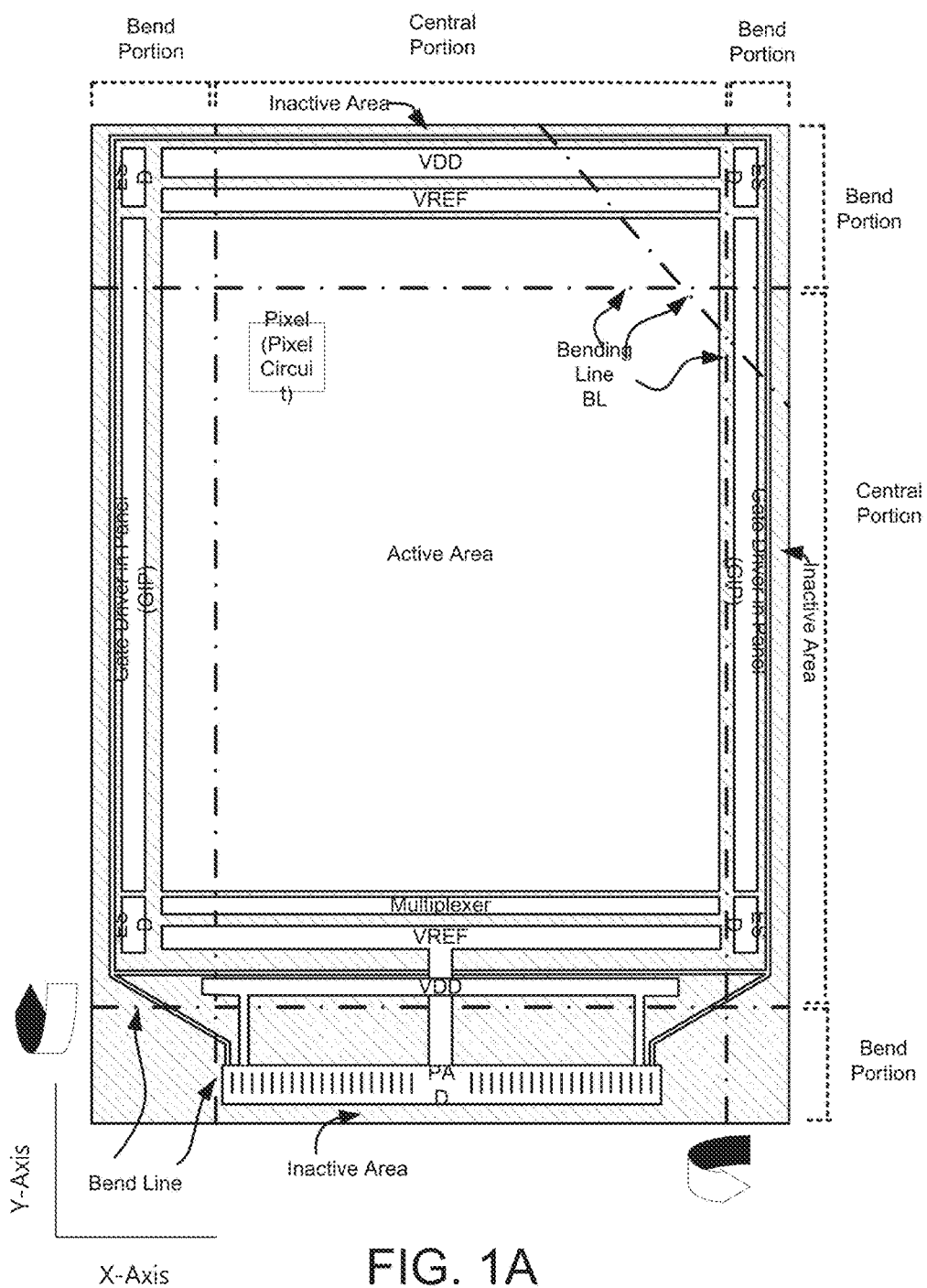
FIGS. 1A, 1B, 2A, and 2B are schematic views of an exemplary flexible display device according to one embodiment.
Figure 1B:
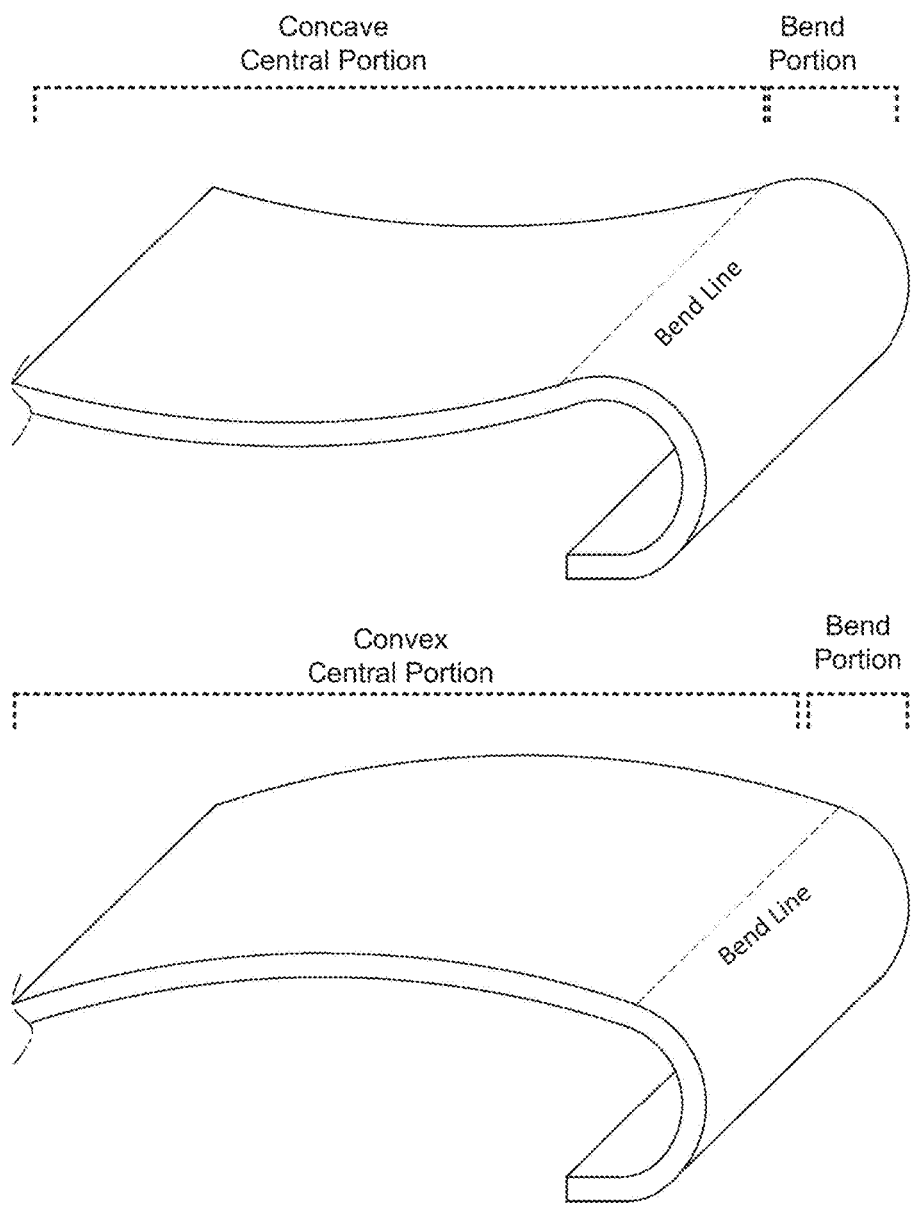

FIG. 1 illustrates an exemplar flexible display 100 which may be incorporated in electronic devices. The flexible display 100 includes at least one active area (i.e., display area), in which an array of display pixels are formed therein. Each pixel may be associated with a corresponding pixel circuit, which may be coupled to one or more signal lines for communicating with the driving circuits (e.g., a gate driver, a data driver, etc.) to activate the pixels. In way of an example, each pixel circuit may be electrically connected to a gate line and a data line.

The flexible display 100 may include one or more inactive areas at the periphery of the active area. That is, the inactive area may be adjacent to one or more sides of the active area such that the active area may be partly or entirely surrounded by the inactive area. For instance, the active area of the flexible display 100 may have a square or a rectangular shape, and the inactive area of the flexible display 100 may surround the active area. However, it should be appreciated that the shapes of the active area and the inactive area are not particularly limited. The active area and the inactive area may be in any shape according to the design of the electronic device employing the flexible display 100. Non-limiting examples of the active area shapes in the flexible display 100 include a pentagonal shape, a hexagonal shape, a circular shape, an oval shape, and more.

The flexible display 100 can include various circuits, which may be used in generating various signals, for example, signals operating the pixels of the flexible display 100 and signals for sensing touch inputs from a user, and various other functionality associated with the flexible display 100 and/or the electronic device employing the flexible display 100.

Some of the circuits may be mounted on an external printed circuit and coupled to a connection interface (Pads/

Bumps) disposed in the inactive area using flexible printed circuit board (FPCB), chip-on-film (COF), tape-carrier-package (TCP) or any other suitable technologies. Also, some of the circuits may be implemented with one or more transistors fabricated in the inactive area of the flexible display 100. For example, one or more gate drivers may be implemented with transistors fabricated in the inactive area as depicted in FIG. 1A. Such gate drivers may be referred to as a gate-in-panel (GIP). It should be appreciated that other types of driving circuits, including but not limited to, an inverter circuit, a multiplexer, data driver, source driver, electro static discharge (ESD) circuit and the like, may also be formed in the inactive area of the flexible display 100.

The transistors used in implementing such driving circuits in the inactive area are not particularly limited. That is, the type of transistors used in implementing the driving circuits in the inactive area need not be the same as the transistors used for implementing the pixel circuits in the active area. The type of transistors may be selected according to the operating conditions and/or requirements of the transistors in the corresponding circuit.

In the embodiments herein, parts of the flexible display 100 may be defined by a central portion and a bend portion. One or more bend portions of the flexible display 100 can be bent away from the tangent plane at a certain bend angle and a bend radius around the betiding axis. A bend portion of the flexible display 100 can be bent away in an inclination angle or in a declination angle at a bend line BL.

The bend line BL may extend horizontally (e.g., X-axis shown in FIG. 1A), vertically (e.g., Y-axis shown in FIG. 1A) or even diagonally in the flexible display 100, or in any other direction of the flexible display 100. Multiple portions of the flexible display 100 can be bent. Accordingly, one or more edges of the flexible display 100 can be bent away from the plane of the central portion along the several bend lines BL. While the bend line BL is depicted as being located towards the edges of the flexible display 100 in the example of FIG. 1A, it should be appreciated that the location the bend lines BL is not limited as such. Any one or more corners of the flexible display 100 may be bent as well. The flexible display 100 can be bent in any combination of horizontal, vertical and/or diagonal directions based on the desired design of the flexible display 100. The bend line BL may be run across the central portion of the flexible display 100 to provide a foldable display or a double-sided display having display pixels on both outer sides of a folded display.

For example, the central portion of the flexible display 100 may be substantially flat, and one or more bend portions may be bent away from the tangent plane of the central portion. The size of each bend portion that is bent away from the central portion needs not be the same.

In some embodiments, the radius of curvatures (i.e., bend radius) for the bend portions in the flexible display 100 may be between about 0.1 mm to about 10 mm, between about 0.1 mm to about 5 mm, or between about 0.1 mm to about 1 mm, or between about 0.1 mm to about 0.5 mm. The smallest bend radius of the bend portion of the flexible display 100 may be less than 0.5 mm.

While the central portion of the flexible display 100 may have a flat surface, some embodiments may not have such a flat central portion. The central portion of the flexible display 100 can be curved-in or curved-out as depicted in FIG. 19, providing flexible display 100 with a concave or a convex central portion. Even in the embodiments with a convex or concave curved central portion, one or more bend portions of the flexible display 100 can be bent inwardly or outwardly along the bend line at a bend angle around a bend axis.

Figure 2A:
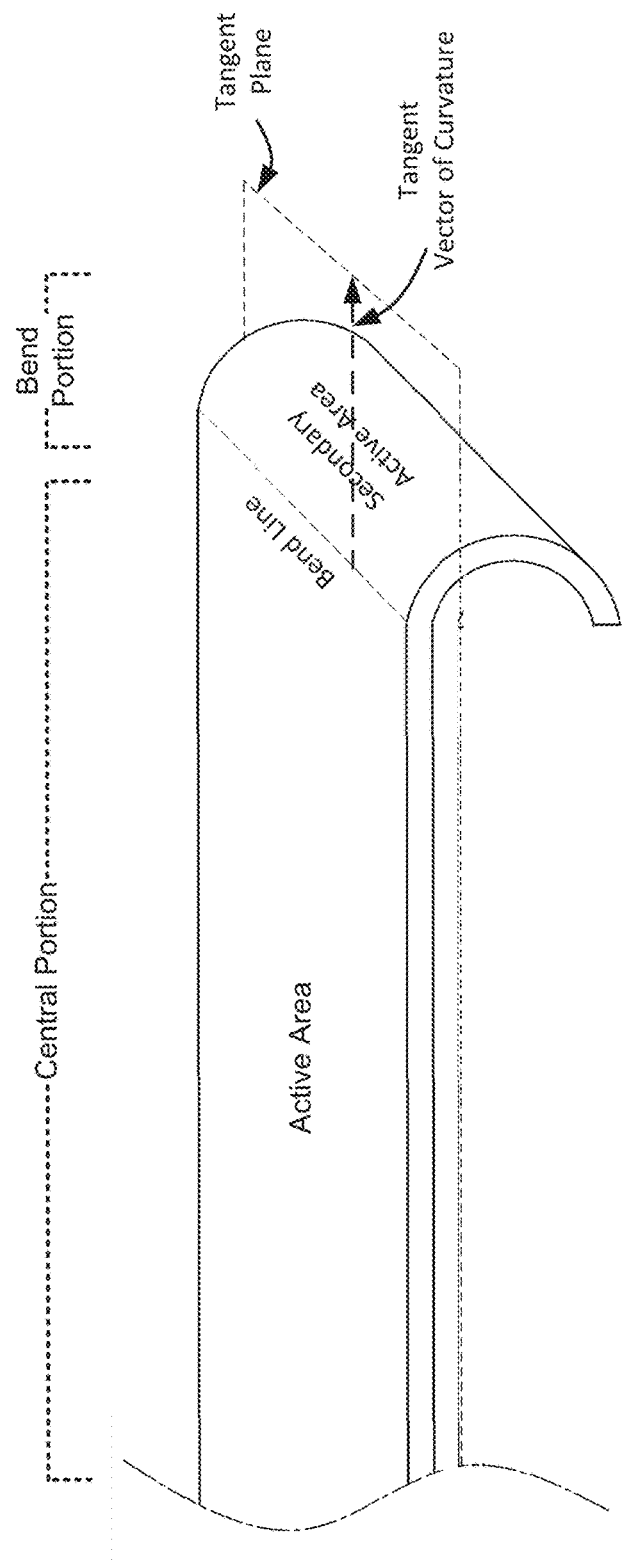
Figure 2B:
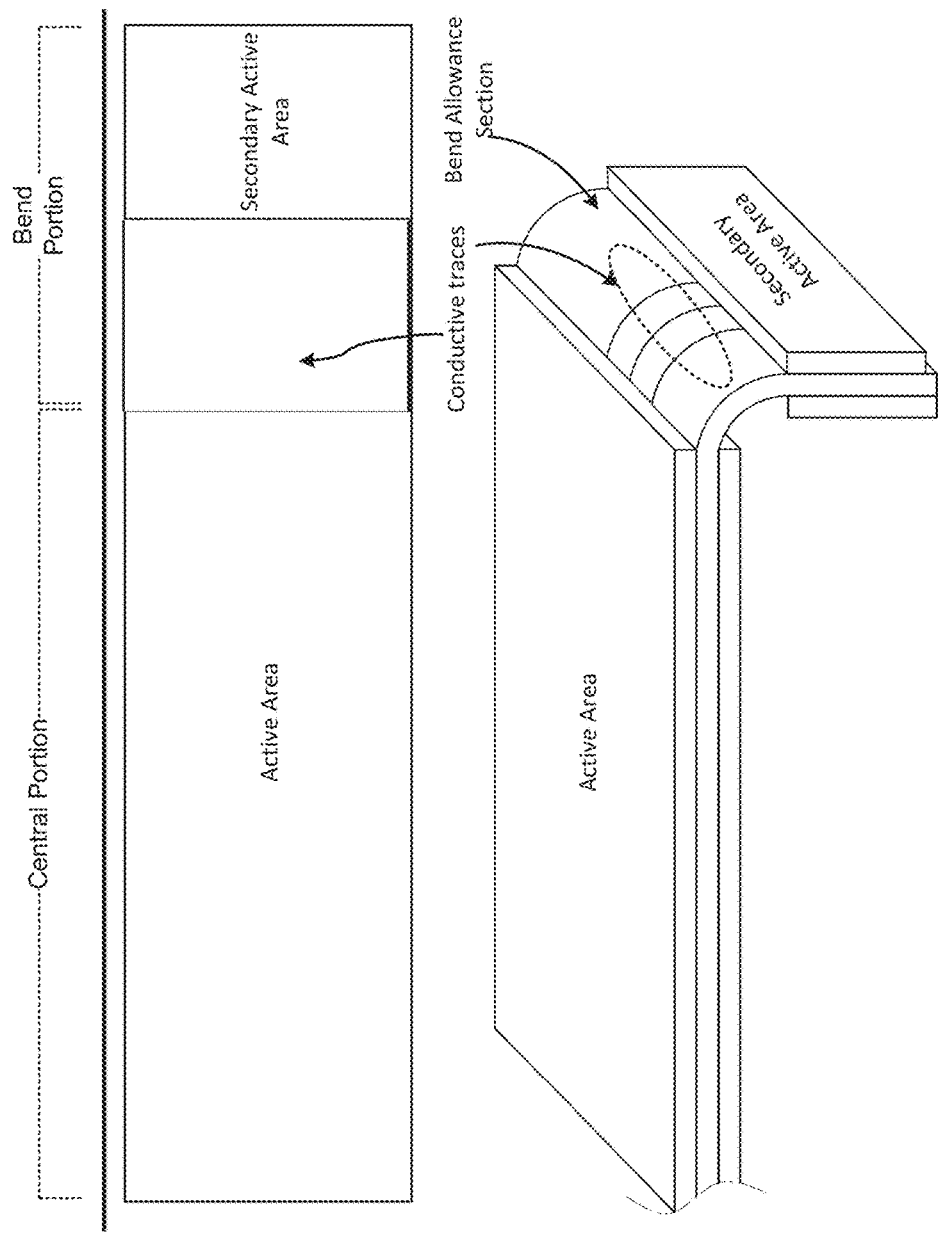

In FIG. 1A, the bend portion of the flexible display 100 may include an active area capable of displaying an image from the bend portion, which is referred herein after as the secondary active area. That is, the bend line can be positioned in the active area so that at least some display pixels of the active area is included in the bend portion that is bent away from the plane of the central portion of the flexible display 100. In this case, the matrix of display pixels in the secondary active area of the bend portion may be continuously extended from the matrix of the display pixels in the active area of the central portion as depicted in FIG. 2A. Alternatively, the secondary active area within the bend portion and the active area within the central portion of the flexible display 100 may be separated apart from each other by the outer bend radius as depicted in FIG. 2B.

The secondary active area in the bend portion may serve as a secondary display area in the flexible display 100. The size of the secondary active area is not particularly limited. The size of the secondary active area may depend on its functionality within the electronic device. For instance, the secondary active area may be used to provide images and/or texts such a graphical user interface, buttons, text messages, and the like. In some cases, the secondary active area may be used to provide light of various colors for various purposes (e.g., status indication light), and thus, the size of the secondary active area need not be as large as the active area in the central portion of the flexible display 100.

The pixels in the secondary active area and the pixels in the central active area may be addressed by the driving circuits (e.g., gate driver, data driver, etc.) as if they are in a single matrix. In this case, the pixels of the central active area and the pixels of the secondary active area may be operated by the same set of signal lines (e.g., gate lines, emission lines, etc.). In way of example, the $N^{th}$ row pixels of the central active area and the $N^{th}$ row pixels of the secondary active area may be configured to receive a signal from the driving circuit via the conductive traces crossing over the bend allowance section as depicted in FIG. 2B.

In some embodiments, the pixels in the secondary active area may be driven discretely from the pixels in the central active area. That is, the pixels of the secondary active area may be recognized by the display driving circuits as being an independent matrix of pixels separate from the matrix of pixels in the central active area. In such cases, the pixels of the central active area and the pixels of the secondary active area may utilize different set of signal lines from each other. Further, the secondary active area may employ one or more display driving circuits discrete from the ones employed by the central active area.

There are several conductive traces included in the flexible display 100 for electrical interconnections between various components therein. The circuits, for instance the ones fabricated in the active area and inactive area, may transmit various signals via the conductive traces to provide a number of functionalities in the flexible display 100. As briefly discussed, some conductive traces may be used to provide electrical interconnections between the circuits and/or other components in the central portion and the bend portion of the flexible display 100.

In the embodiments herein, the conductive traces may include source/drain electrodes of the TFTs as well as the gate lines/data lines used in transmitting signals from some of the display driving circuits (e.g., gate driver-IC, data driver-IC) in the inactive area to the pixels in the active area.

Likewise, some conductive traces like touch sensor electrodes or fingerprint sensor electrodes may provide signals for sensing touch input or recognizing fingerprints on the flexible display 100. The conductive traces can also provide interconnections between the pixels of the active area in the central portion and the pixels of the secondary active area in the bend portion of the flexible display 100. Still other conductive traces may be used to provide power (e.g., supply voltage) to circuit components within the flexible display 100. Aforementioned uses of conductive traces are merely illustrative. As used herein, the conductive traces broadly refer to a conductive path for transmitting any type of electrical signals, power and/or voltages from one point to another point in the flexible display 100.

Some of the conductive traces may be extended from the central portion to the bend portion of the flexible display 100. In such cases, some portions of the conductive traces may be configured differently from the other portions to withstand the bending stress. In particular, the portion of the conductive traces over at least the bend allowance section of the flexible display 100 may include several features that can reduce cracks and fractures of the conductive traces to maintain proper interconnection.

At least some of the conductive traces may have a multi-layered structure, which may allow more stretching (or flexibility) with less chance of breakage and to reduce galvanic corrosion as will be further described below.

Conductive Traces

In one embodiment, a conductive trace is multi-layered. The conductive trace may include a lower protection layer such as a passivation layer, a metal layer which is a metal trace line formed on the lower protection layer, and an upper protection layer such as a passivation layer that is formed on the metal layer, as will be further described below in more detail with respect to FIG. 5.

The trace design is determined by considering the electrical requirements of the conductive trace as well as the type of signals transmitted on the conductive trace. Also, the properties of the materials (e.g., Young's modulus) used in forming the conductive trace can be considered in designing the traces. It should be noted that various other factors such as a thickness, a width, a length, a layout angle for a section as well as for the entirety of the metal trace line and the passivation layers may need to be considered to provide a trace design having sufficient electrical and mechanical reliability for use in the flexible display 100.

The conductive trace design may be specifically tailored for the conductive trace based on their placement and orientation in reference to the bending direction (i.e., tangent vector of the curve) of the flexible display 100. A conductive trace will be subjected to more bending stress as the orientation in which the conductive trace extends is more aligned to the tangent vector of the curvature. In other words, a conductive trace will withstand better against the bending stress when the length of the conductive trace aligned to the tangent vector of the curvature is reduced.

In order to reduce the length of the conductive trace portion being aligned to the tangent vector of the curvature, conductive traces of the flexible display 100 may employ any one or more winding designs as will be further described below. In such configurations, the bending stress may be distributed to the trace portions oriented in an angle shifted away from the tangent vector of the curvature.

Figure 3A:
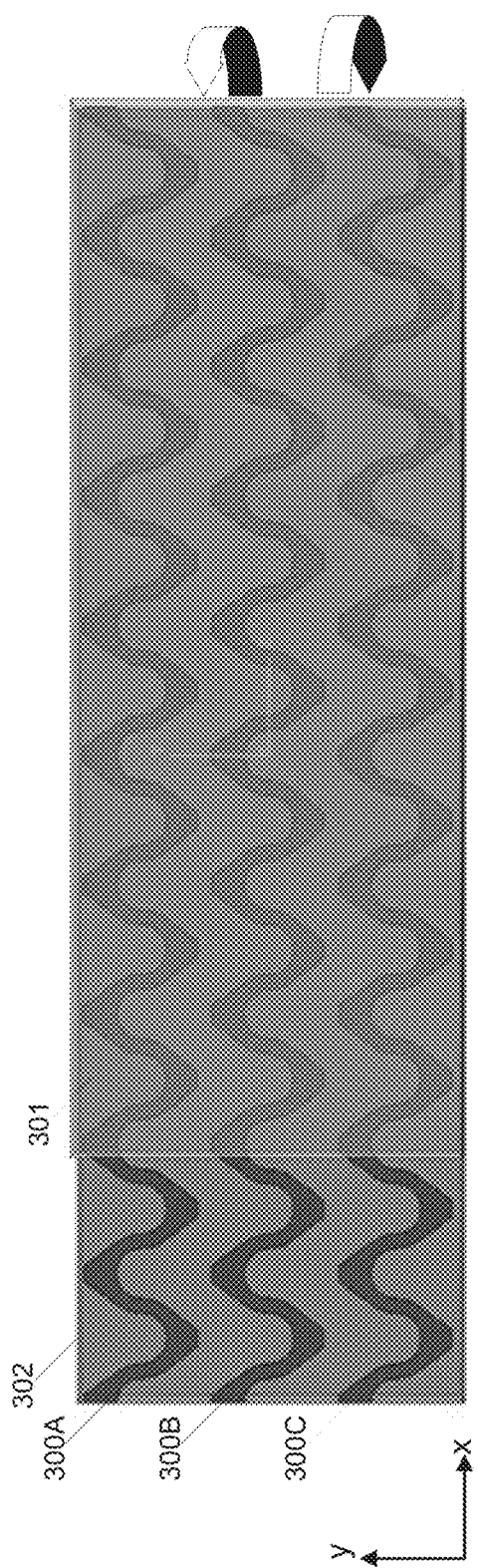
FIGS. 3A and 3B are respectively a schematic plane view and corresponding perspective view of a winding conductive trace of the exemplary flexible display device according to one embodiment.
Figure 3B:
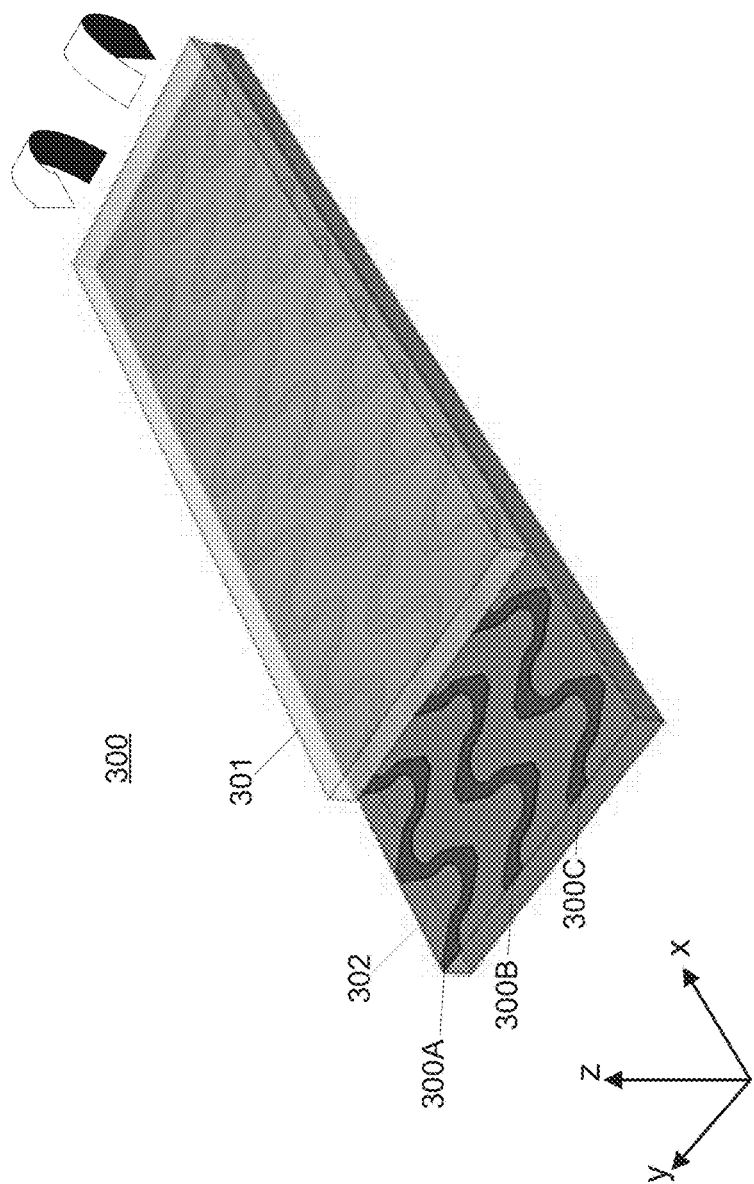

FIGS. 3A and 3B respectively illustrate a plane view and a perspective view of a winding conductive trace 300 according to one embodiment. As shown in FIGS. 3A and 3B, the winding conductive trace 300 is formed on a flexible substrate 302 and a cover layer 301 is formed on the substrate 302 to cover and protect the winding conductive trace 300 from external elements such as moisture or air that can degrade the winding conductive trace 300.

Figure 4:
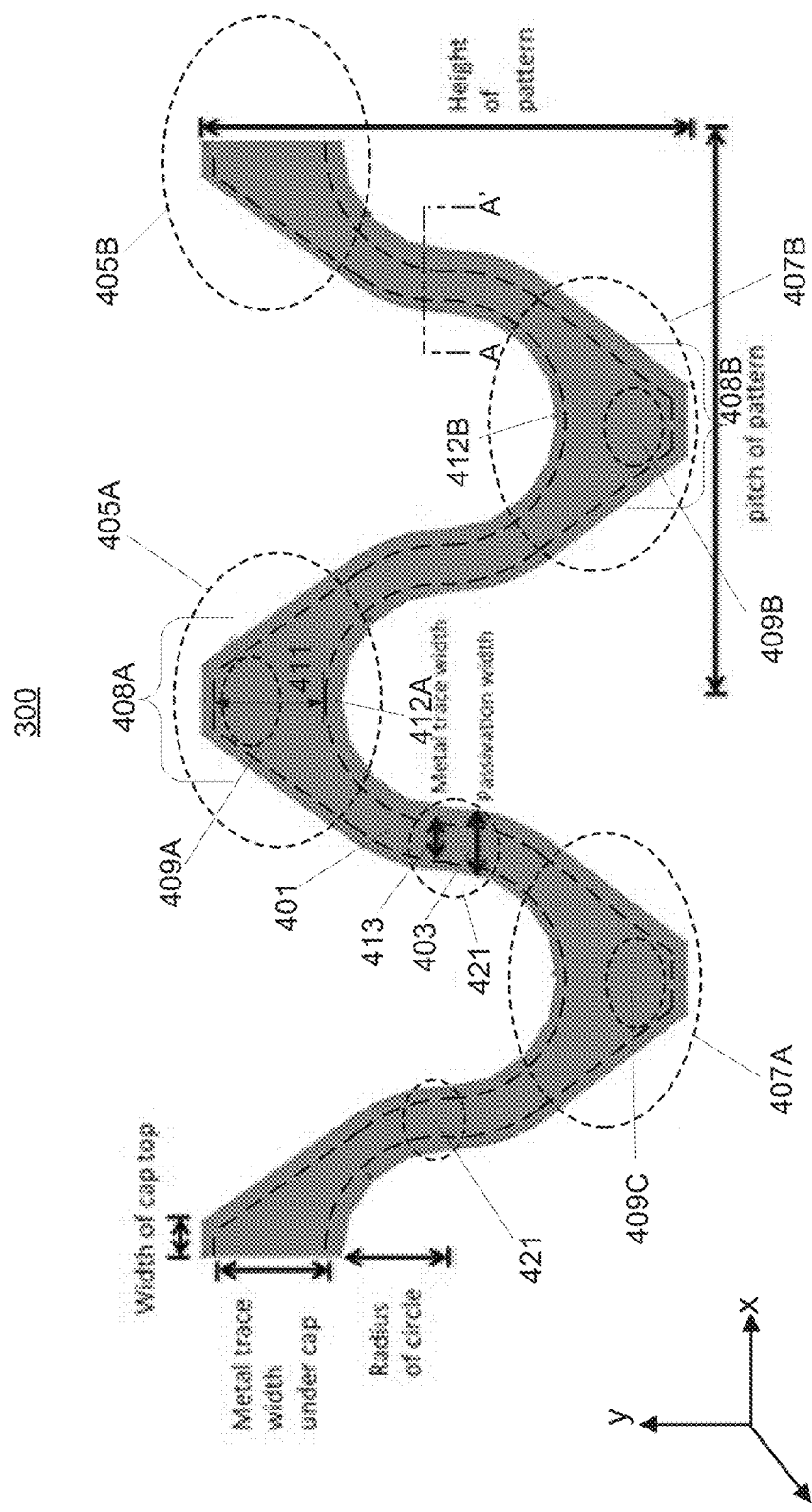
FIG. 4 is a detailed view of the winding conductive trace according to one embodiment.

In one embodiment, the winding conductive traces 300A, 300B, and 300C have a winding trace pattern that is curved and includes caps as will be further described with respect to FIG. 4. The winding trace pattern of the winding conductive trace 300 is more resistant to bending and stretching stresses compared to conventional trace patterns (e.g., straight line trace patterns or sign wave wire patterns) due to the caps included in the winding conductive traces 300. In the example shown in FIGS. 3A and 3B, the winding conductive traces 300 are subject to bending in either direction perpendicular to the substrate 300 (e.g., the "z" axis direction as shown in FIG. 3B) or in an angled direction, as shown with the arrows. The winding conductive trace 300 maintains integrity without cracking or delamination when the flexible display 100 is bent as will be further described below.

FIG. 4 is a detailed plane view of a winding conductive trace 300 according to one embodiment. The winding conductive trace 300 resembles a temple gate structure. The width of the metal trace line 401 is represented by the dashed lines in FIG. 4 and varies depending on the location on the winding conductive trace 300. The passivation layer 403 generally has a width that is larger than that of the metal trace line 401 throughout the winding conductive trace 300, and the width of the passivation layer 403 in various portions of the winding conductive trace 300 corresponds to the width of the metal trace line 401. In other words, in a plane view as depicted in FIG. 4, the trace shape of the passivation layer 403 is substantially identical to the trace shape of the metal trace line 401, but with a predetermined margin beyond the width of the metal trace line 401.

The metal trace line 401 may be formed of conductive materials such as copper, gold, silver, and other types of coated or printed materials. Although the term "metal trace line" is used, it should be noted that the metal trace line in the winding conductive trace 300 may be replaced with other types of conductive materials, such as carbon based materials (e.g., graphene, carbon nanotube), conducting polymers, and other non-metal based conductive materials. Furthermore, the metal trace line need not be straight. The metal trace line can be curved. With bend radius requirement at the bend allowance section of the flexible display 100, however, the materials for forming the winding conductive trace 300 should meet the minimum mechanical requirement and the size requirement as well as the stringent electrical requirements of the flexible display 100. The metal trace line 401 can comprise one or more metal layers such as aluminum and other metals. In some embodiments requiring less flexibility in the winding conductive trace 300, molybdenum or other conductive materials discussed above may be used.

The passivation layer 403 may be formed of inorganic materials which are generally less ductile than the metal trace line 401 of the winding conductive trace 300. Examples of the materials used to form the passivation layer include inorganic materials such as silicon nitride, silicon dioxide and other dielectric materials commonly used in semiconductor device and other electronics processing.

Given the same amount of bending stress, cracks generally initiate from the passivation layer of the winding conductive trace 300. Even if the metal trace lines have sufficient strength to withstand the bending stress without cracking, cracks are generally initiated from the passivation layer and tend to grow and propagate into the metal trace lines of the winding conductive trace 300, creating spots of poor electrical contacts that could render the flexible display 100 unusable. Accordingly, various bending stress reduction techniques are utilized in both the passivation layers and the metal trace line of the winding conductive traces 300, according to the embodiments herein.

As shown in FIG. 4, the winding conductive trace 300 includes a plurality of alternating crests 405 (e.g., 405A, 405B, . . . ) and alternating troughs 407 (e.g., 407A, 407B, . . . ). Each crest 405 includes a convex edge 408 (e.g., 408A) of the winding conductive trace 300 exhibiting the local maximum amounts of upward distance in the y-direction from the rest of the portions of the winding conductive trace 300. In one embodiment, the convex edge 408 is a surface (e.g., a first edge) of the winding conductive trace 300 that is curved like the exterior of a trapezoid. Conversely, each trough 407 includes another convex edge 408 (e.g., 408B) of the winding conductive trace 300 exhibiting the local maximum of downward distance in the y-direction from the rest of the portions of the winding conductive trace 300.

The total distance from a convex edge of a crest (e.g., e.g., 408A) to a convex edge of a trough (e.g., 408B) of the winding conductive trace 300 in the y-direction represents the height of winding conductive trace 300. The total distance from a first crest 405A to an adjacent second crest 405B in the x-direction represents the pitch (width) of the winding conductive trace 300. The pitch of the winding conductive trace 300 is approximately one times (1×) the height of the winding conductive trace 300 in ne embodiment. However, other pitches may be used such as 0.3 times (0.3×) to 0.5 times (0.5×) the height of the winding conductive trace 300 or 2 times (2×) to 3 times (3×) the height of the winding conductive trace 300.

Additionally, each crest 405 and trough 407 of the winding conductive trace 300 includes a concave edge 412, (412A, 412B, . . . ) located opposite to the convex edge 408 of each respective crest and trough. A concave edge 412 of each crest and trough is substantially rounded (e.g., like a half-circle) shape with a radius that is maximized according to the height and pitch of the winding conductive trace 300. The concave edge 412 represents a surface (e.g., a second edge) of the winding conductive trace 300 that curves inward like the interior of a circle or sphere. It should be noted that the concave edges 412 may be other shapes other than a half circle. The trace of the concave edges 412 may simply be more rounded than the trace of the convex edges at the troughs and crests.

During bending of the flexible display 100 (e.g., in the "z" axis direction), the concave edge 412 of the winding conductive trace 300 is an area of high stress whereas the convex edges 408 are areas of low stress. Cracks typically start to occur at the passivation layer 403 located at the concave edges 412 of the winding conductive trace 300 during bending of the flexible display 100. The cracks tend to grow and propagate into the metal trace line 401 of the winding conductive trace 300 thereby creating spots of poor electrical contacts that could render the flexible display 100 unusable.

In one embodiment, the winding conductive trace 300 includes caps 409 (409A, 409B, 409C . . . ) that are portions of the metal trace line 401 located between the convex edges 408S and concave edges 412 of each crest 405 and trough 407 and extend beyond the width 413 of the metal trace line without the cap 409. The width 411 of the metal trace line 401 located in the regions of the winding conductive trace 300 that include the caps 409 is wider than the width 413 of the metal trace line 401 located in intermediate portions 421 of the winding conductive trace 300 located between each alternating crest (e.g., 405A) and trough (e.g., 407A or 407B). Due to the wider width 411 of the metal trace line 401 including the cap regions 409 (e.g., 409A, 409B, 409C . . . ), cracks in the passivation layers located at the concave edges 412 will not propagate across the entire width 411 of the metal trace line 401, and thus electrical connections will be maintained even if cracks are formed in the concave edges 412 due to bending. For example, the metal trace line 401 in crest 405A is provided with a cap 409A. If a crack propagates across a portion of the width 411 of the metal trace line 401, spots of poor electrical contact are prevented since the width 411 of the metal trace line 401 including cap 409A is wider than the width 413 of the metal trace line 401 at the intermediate portions 421. Furthermore, since the cap 409A is located at a low stress region of the winding conductive trace 300 during bending of the flexible display 100, it is unlikely for the crack to propagate across the width 411 of the metal trace line 401 including cap 409A. In one embodiment, the cap 409 is similar to a trapezoid in shape as shown in FIG. 4. The trapezoidal shape of the cap 409 is defined by the convex edge 408 of the winding conductive trace 300.

In some embodiments, the width 411 of the metal trace line 401 is roughly three times the width 413 of the concentric circle segment (e.g., concave edge 412). Although the cap 409 is described as being trapezoidal in shape 300, the cap 409 can be other shapes which can be chosen based on electric static discharge (ESD) requirements, stress requirements, and nesting requirements as will be further described below.

In one embodiment, the intermediate portion 421 includes the passivation layers 403 and the metal trace line 401 that extend from the portion of the winding conductive trace 300 located between a convex 408 edge and a concave edge 412 located opposite the convex edge 408. As shown in FIG. 4, the intermediate portion 421 lacks (i.e., does not have) the cap 409. In other words, the width of the winding conductive trace 300 is at its minimum at the intermediate portion 421.

The width 411 of the metal trace line 401 located between the convex edge 408 and concave edge 412 of a crest/trough that includes a cap 409 is larger than the width 413 of the metal trace line 401 located at the intermediate portion 421 that lacks the cap 409. In contrast, the width of the passivation layers 403 varies based on the position of the winding conductive trace 300. That is, the width of the passivation layers 403 varies according to the width of the metal trace line 401. For example, in one embodiment the width of the passivation layer 403 located in the intermediate portion 421 is smaller than the width of the passivation layer located between a convex edge 408 and a concave edge 412 opposite the convex edge of each crest and/or trough.

Figure 5:
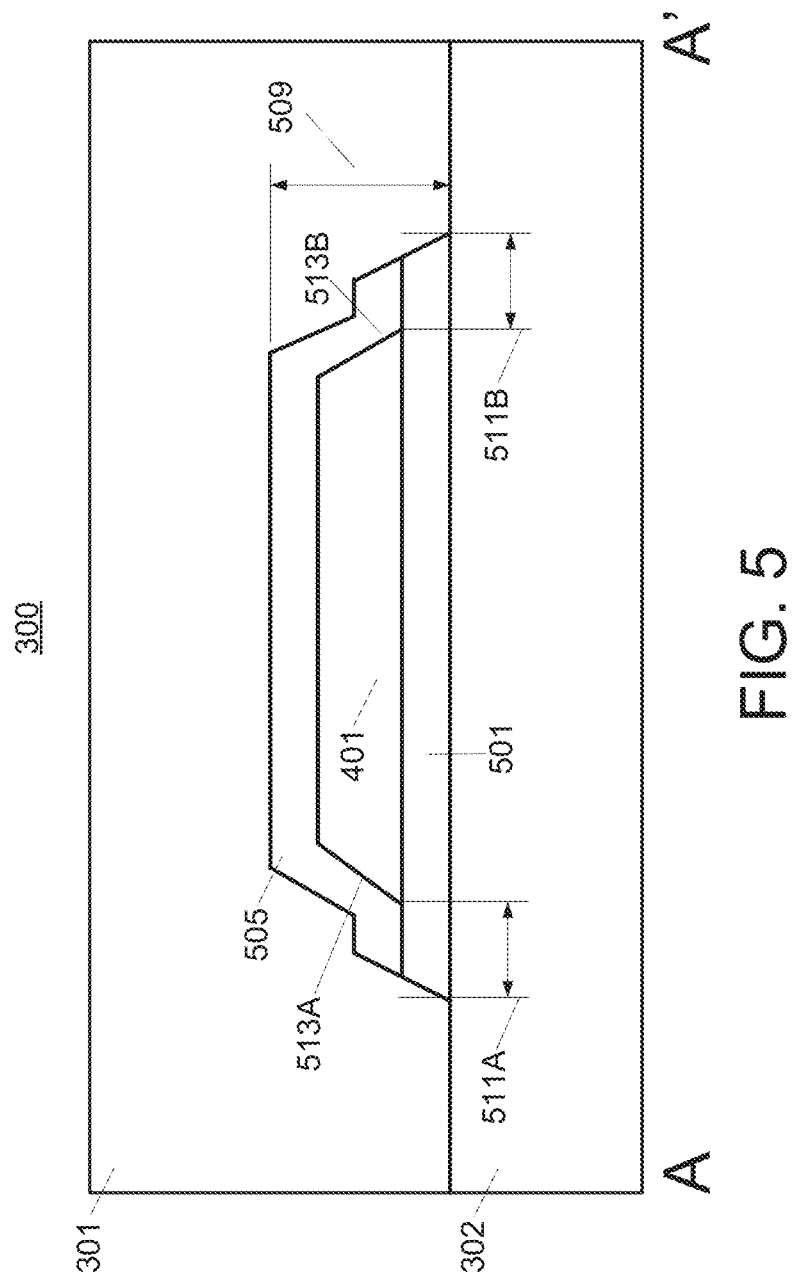
FIG. 5 is a cross-section view of the wire trace according to one embodiment.

FIG. 5 is a cross-section view of the winding conductive trace 300 along line A to A' shown in FIG. 4 according to one embodiment. As shown in FIG. 5, the winding conductive trace 300 includes a first passivation layer 501 formed on the substrate 302. The first passivation layer 501 may be made of inorganic material such as silicon oxide ($SiO_2$), silicon nitride ($SiNx$), and a combination of both. The substrate 302 may be made of flexible material such as polyimide.

The metal trace line 401 is formed on the first passivation layer 501. The metal trace line 401 may be made of aluminum or may be a combination of conductive material. A second passivation layer 505 is formed over the metal trace line 401. The second passivation layer 505 can also be made of inorganic material such as $SiO_2$ and/or $SiNx$. As shown in FIG. 5, the first passivation layer 501 and the second passivation layer 505 cover all sides of the metal trace line 401. The first passivation layer 501 and the second passivation layer 505 form a protective layer around the metal trace line 401 that protects the metal trace line 401 from moisture and/or air. The first passivation layer 501, the second passivation layer 505, and the metal trace line 401 collectively represent the winding conductive trace 300 according to one embodiment. As shown in FIG. 5, a cover layer 301 is formed over the second passivation layer 505, the metal trace line 401, the first passivation layer 501, and the substrate 300 to provide further protection from moisture and/or air. The cover layer 301 can be made of any polymer. The total height 509 of the winding conductive trace 300 may be 10 to 1000 nm in one embodiment.

In one embodiment, the width of the first passivation layer 501 and the width of the second passivation layer 505 are designed to extend past edges 513 of the metal trace line 401. The first passivation layer 501 and second passivation layer 505 are designed to be long enough to protect the metal trace 401 from moisture and/or air, but cannot be too long as the first passivation layer 501 and second passivation layer 505 may crack too easily when bent. In one embodiment, the portion 511A of the first passivation layer 501 and the second passivation layer 501 extend past edge 513A of the metal trace line 401 and portion 511B of the first passivation layer 501 and the second passivation layer 501 extend past edge 513B of the metal trace line 401. The portions 511 that extend past the edges 513 of the metal trace line 401 are at most 10 μm in some embodiments.

As mentioned previously, the width of the passivation layers vary based on the position of the winding conductive trace 300. For example, the width of the first passivation layer 501 in the intermediate portion 421 has a width that is smaller than the width of the first passivation layer 501 in the portion of the winding conductive trace 300 between a convex edge 408 and concave edge 412 of each crest and trough. Similarly, the width of the second passivation layer 505 in the intermediate portion 421 has a width that is smaller than the width of the second passivation layer 505 in the portion of the trace 300 between a convex edge and concave edge. In one embodiment, the width of the first passivation layer 501 and the width of the second passivation layer 505 in the intermediate portion 421 are substantially the same and the width of the first passivation layer 501 and the width of the second passivation layer 505 in the portion of the winding conductive trace 300 between a convex edge and a concave edge of a crest and trough are substantially the same.

In one embodiment, the target bending radii of curvature of the flexible display device 100 may be as small as 0.1 mm if a cover layer 301 is applied as shown in FIG. 5. The cover layer 301 is chosen to place the winding conductive trace 300 in or near the mechanical neutral plane of the flexible display device 100. The design of the cover 301 is based on the thickness, modulus, and residual stress of the substrate 302 and cover layer 301. Since the winding conductive trace 300 including the passivation layers 501, 505 and metal trace 401 is typically very thin compared to the substrate 302 and cover layer 301, the thickness of the passivation layers 501, 503 and metal trace 401 can be ignored when designing the thickness of the cover layer 301. In one embodiment, the neutral plane design of the cover layer 301 is calculated according to the following equation:

$$\text{substrateModulous} \cdot (\text{substrate Thickness})^2 = \text{coverlayerModulous} \cdot (\text{coverlayerThickness})^2$$

As shown above, the product of the modulus of the substrate 302 and the thickness of the substrate 302 squared is equivalent to the product of the modulus of the cover layer 301 and the thickness of the cover layer 301 squared in order to keep the substrate 302 and the cover layer 301 bending together without being delaminated when bent. Once the materials for the substrate 302 and cover layer 301 are known as well as the thickness of the substrate 302, the thickness of the cover layer 301 can be determined.

Figure 6:
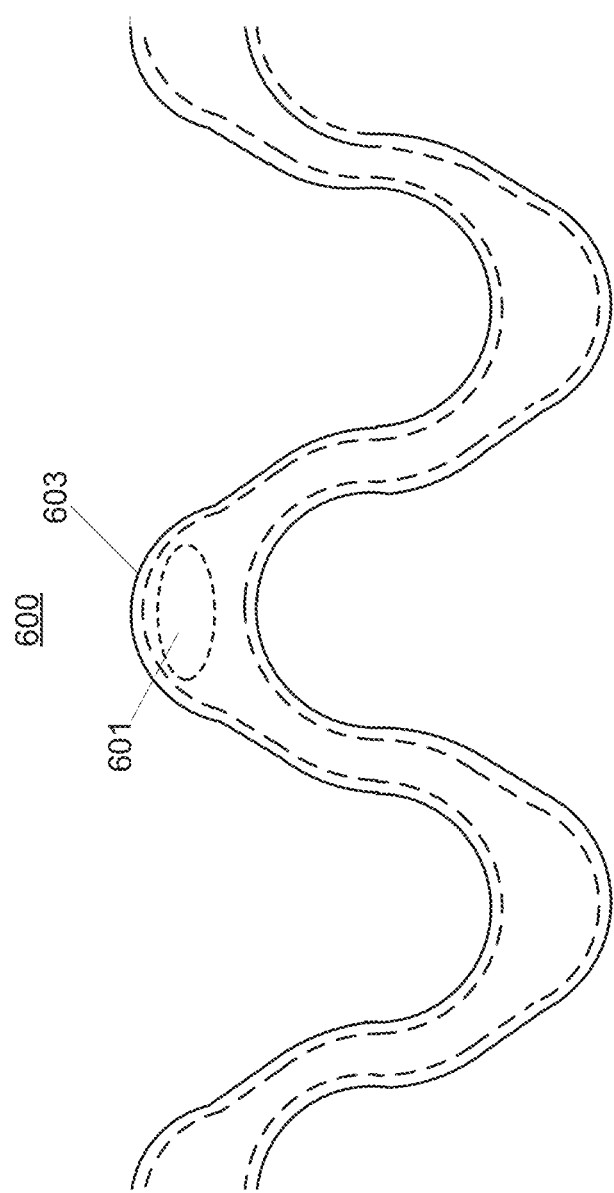
FIG. 6 is a detailed view of a winding conductive trace according to another embodiment.

FIG. 6 illustrates a trace pattern of a winding conductive trace 600 according to another embodiment. As mentioned above, FIGS. 3-4 illustrate a winding conductive trace with a trapezoidal shaped cap 409. In contrast, FIG. 6 illustrates a winding conductive trace 600 with rounded caps 601. The rounded shape of the cap is defined by the convex edge 603 of the winding conductive trace 600. The winding conductive trace 600 includes similar features as the winding conductive trace 300 described above, the description of which is omitted for brevity.

The rounded cap 601 reduces the generation of electrical fields between adjacent winding conductive traces that use the rounded cap 601. In contrast, winding conductive traces that use pointed caps such as trapezoidal caps 409 may increase the electrical field formed between two adjacent winding conductive traces. Strong electrical fields generated between adjacent traces may cause the passivation layers covering the metal trace to deteriorate. On the other hand, winding conductive traces 600 using rounded caps 601 may not be able to be packed as tightly together due to the larger surface area of the rounded cap 601, compared to the trapezoidal shaped cap 409.

Figure 7:
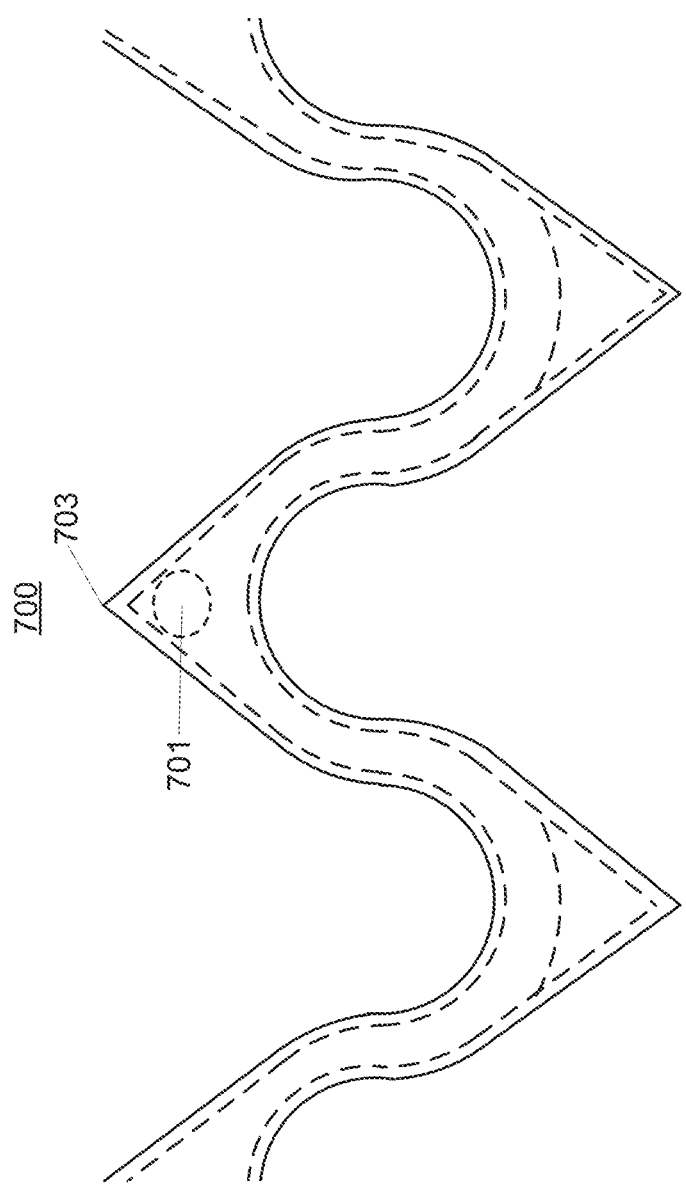
FIG. 7 is a detailed view of a winding conductive trace according to still another embodiment.

FIG. 7 illustrates a winding conductive trace 700 according to another embodiment. In particular, FIG. 7 illustrates a winding conductive trace 700 with triangular caps 701. The triangular shape of the cap 701 is defined by the convex edge 703 of the winding conductive trace 700. The winding conductive trace 700 also includes similar features as the winding conductive trace 300 described above, the description of which is omitted for brevity.

The triangular cap 701 improves the ability to tightly pack more winding conductive traces 700 together due to the smaller surface area of the triangular shaped cap 701 compared to the rounded cap 601. However, the triangular cap 701 may increase the electrical field formed between adjacent winding conductive traces due to the pointed nature of the triangular cap 701. The sharp points of the triangular cap 701 may increase the electrical field generated between adjacent winding conductive traces, which in turn may cause the passivation layers covering the metal wire trace to deteriorate.

Mirrored Wiring

Figure 8A:
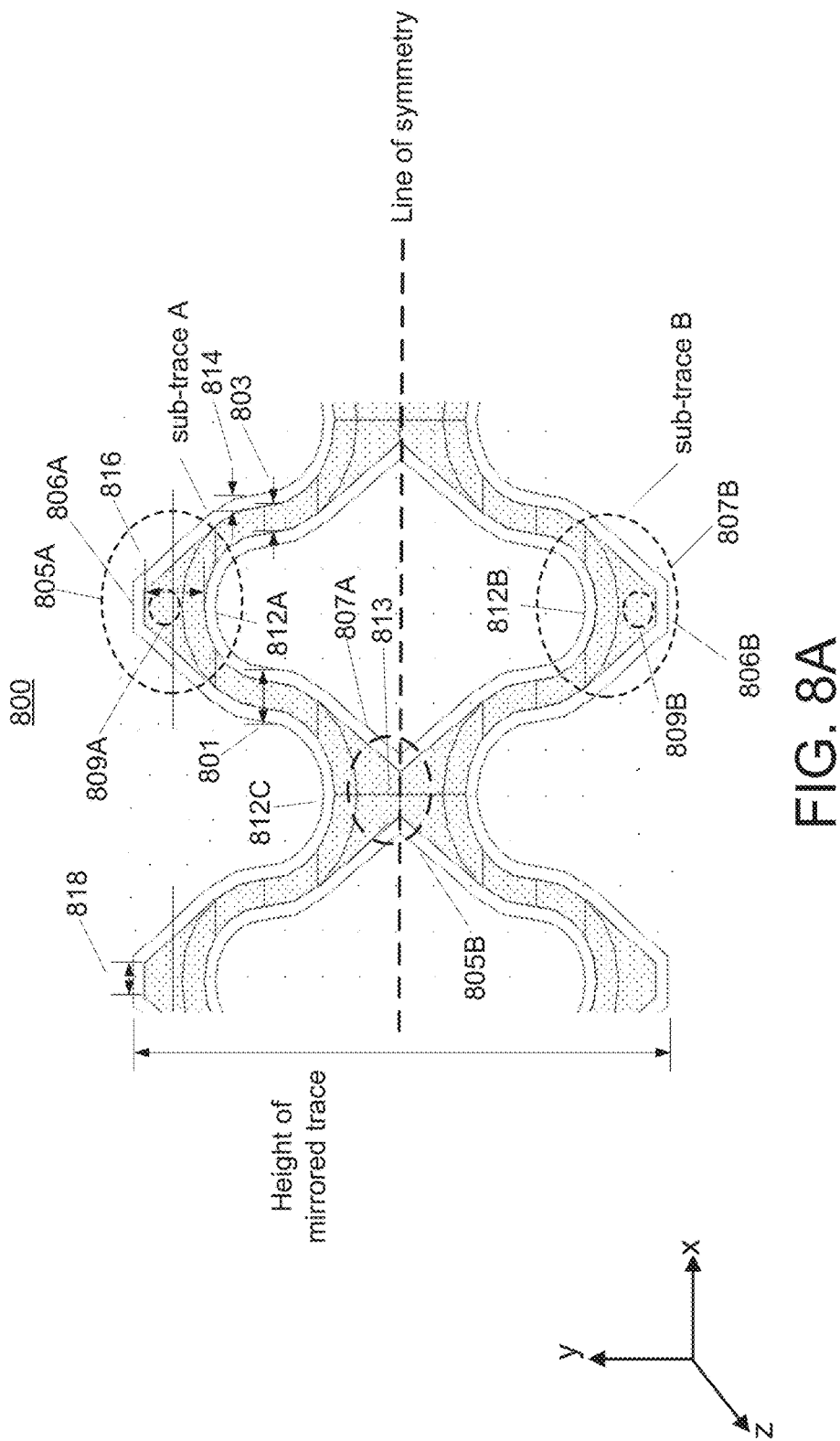
FIG. 8A a detailed view of mirrored conductive traces according to one embodiment.

In order to prevent or minimize severance of interconnections by cracks in the winding conductive traces, the winding conductive traces may split into multiple sub-traces, which converge back into a single trace at certain intervals. FIG. 8A illustrates a detailed view of a mirrored trace 800 according to one embodiment. The mirrored trace 800 includes two symmetric winding conductive traces that are adjoined in a mirrored configuration and are symmetric with respect to the line of symmetry shown in FIG. 8A. The mirrored trace 800 resembles a double temple gate structure. In the example shown in FIG. 8A, the mirrored trace 800 is composed of two winding conductive traces each of which with a trapezoidal cap as shown in FIG. 4. The mirrored trace 800 is alternatively composed of two winding conductive traces each of which with a rounded cap as shown in FIG. 6 or two winding conductive traces each of which with a triangular cap as shown in FIG. 7.

In one embodiment, the mirrored trace 800 includes sub-trace A and sub-trace B, which merge back together at every joint 813. The metal trace line of sub-trace A and sub-trace B at joint 813 may have a height in the y-direction of 17.48 μm. Each sub-trace A, B is multi-layered such that the trace of the passivation layer covers at least some part of the metal trace lines. The width of the mirrored trace 800 corresponds to the width 801 of the passivation layer and the width 803 is the width of the metal trace line that is at least partially covered by the passivation layer similar to the single winding conductive trace described above. In one embodiment, the width 803 of the metal trace line may be in a range of about 2 μm to about 3 μm. In one embodiment, the distance 814 that the passivation layer extends past the edge of the metal trace line may be in a range of about 1.0 μm to about 1.5 μm.

As shown in FIG. 8A, sub-trace A has a winding conductive trace pattern that includes a plurality of alternating crests (e.g., crest 805A) and troughs (e.g., trough 807A). Each crest 805 and trough 807 includes a convex edge 806 (e.g., 806A and 806B) and a concave edge 812 (e.g., 812A and 812B) similar to the description described above with respect to FIG. 4. Similarly, sub-trace B also has a winding conductive trace pattern that includes a plurality of alternating crests (e.g., crests 805B) and troughs (e.g., trough 807B). Each crest and trough of sub-trace B also includes a convex edge 806 and a concave edge 812 similar to the description described above with respect to FIG. 4. The total distance from the convex edge of crest 805A of sub-trace A to the convex edge of trough 807B of sub-trace B in the y-direction represents the height of the mirrored trace 800.

Sub-trace A includes a cap 809A and sub-trace B includes a cap 809B at low stress portions of the mirrored trace 800 to prevent cracks from propagating across the width 816 of the metal trace line that include the cap, in order to prevent poor electrical contact. The cap top 818 represents a substantially flat edge of the caps 809.

As mentioned above, the crest 805 of sub-trace A also has a concave edge 812A and the trough 809B of sub-trace B has a concave edge 812B that are substantially rounded, like a half-circle in shape. During bending of the flexible display 100, the concave edges 812 of the crests and troughs are areas of high stress whereas the convex portions (e.g., 806) of the crests and troughs are areas of low stress. Cracks typically start to occur at the passivation layer located at the concave edges 812 of the crests and troughs of the mirrored trace 800 during bending of the flexible display 100. The rounded shape of the concave edges 812 of sub-trace A and sub-trace B distribute the mechanical stress over the larger area of the concave edges 812 thereby reducing the onset of a crack generation.

However, if cracks occur at the passivation layer located at the concave edges 812 of the mirrored trace 800, they could grow and propagate into the metal trace lines of the mirrored traces 800. Advantageously, if a crack propagates across a portion of the width 816 of the metal trace line, spots of poor electrical contact are prevented since the width 816 of the metal trace line include the cap region 809 that is wider than the width 803 of the metal trace line at the intermediate portions without the cap 809. Furthermore, since the cap 809 is located at a low stress region, it is unlikely that cracks will propagate across the width 816 of the metal trace line that includes the cap 809 during bending of the flexible display 100.

In one embodiment, alternating concave edges of a sub-trace have different radii. For example, concave edge 812A of sub-trace A may have a radius of 8.1 μm whereas concave edge 812C of sub-trace A may have a radius of 9.46 μm. In other embodiments, alternating concave edges of the sub-trace may have substantially the same radii.

Furthermore, by splitting the mirrored trace 800 into multiple sub-traces, a backup electrical pathway is provided in case one of the sub-traces is damaged by cracks. As such, the mirrored trace 800 can be used in the bend portion, and may be particularly helpful within the bend allowance section subjected to severe bending stress.

Figure 8B:
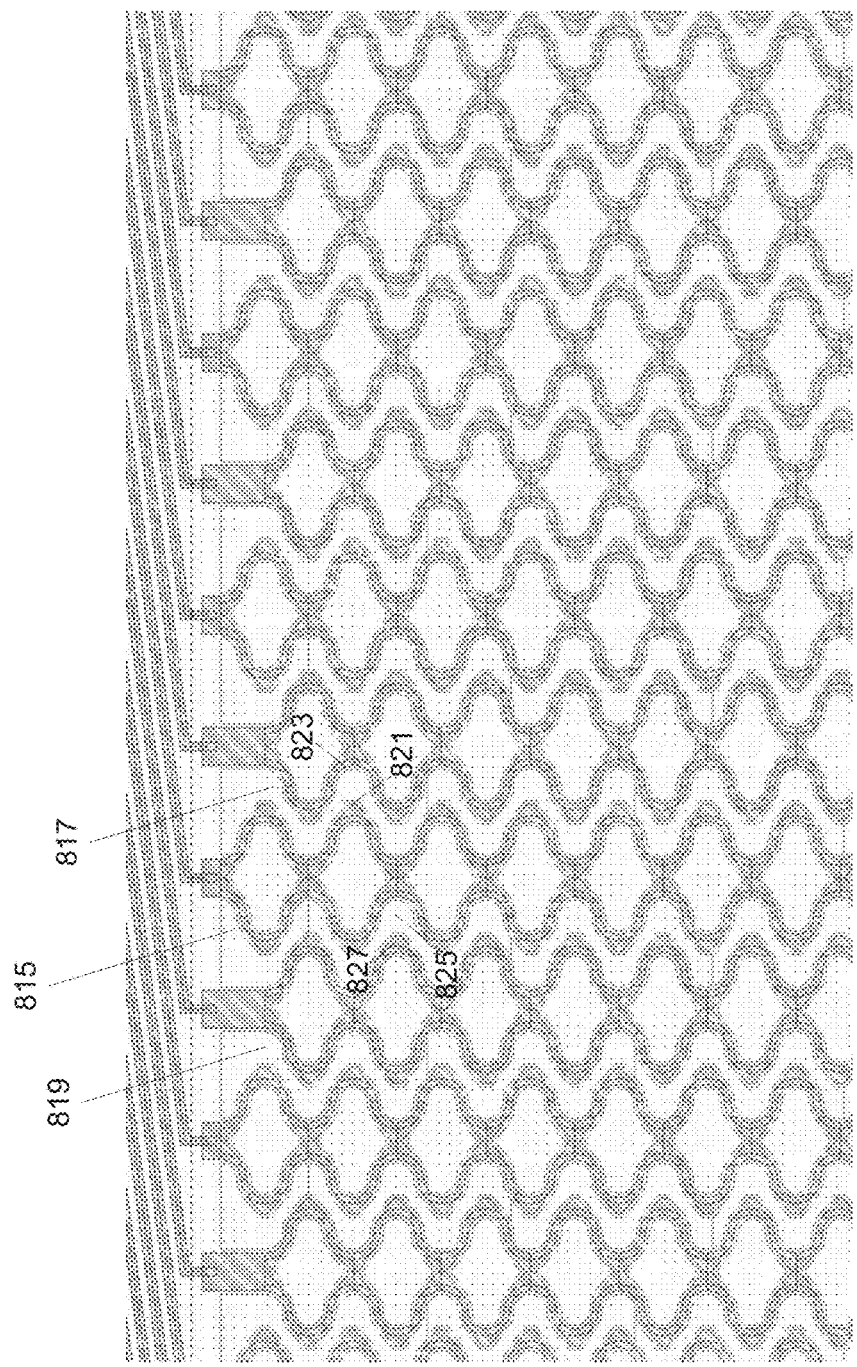
FIG. 8B illustrates a staggered arrangement of multiple mirrored conductive traces according to one embodiment.

Referring now to FIG. 8B, a plurality of mirrored traces 800 are shown in a staggered configuration. In FIG. 8B, the mirrored traces 800 are positioned adjacent to each other in a staggered configuration to maximize the number of wires in a given area. The mirrored traces 800 are staggered such that the convex edge of a given double-temple gate trace is placed in line with a concave edge of an adjacent mirrored trace. The size of the mirrored trace can be reduced or increased for more efficient use of the given space. Furthermore, the dimension of two adjacent mirrored traces can be different from each other. For example, the size of the concave edge of a first mirrored trace can be larger or smaller than the size of the concave edge of an adjacent second mirrored trace.

For example, FIG. 8B includes a first mirrored trace 815. A second mirrored trace 817 is adjacent to a first sub-trace of the first mirrored trace 815 and a third mirrored trace 819 is adjacent to a second sub-trace of the first mirrored trace 815. In one embodiment, each convex edge 821 of the first sub-trace of the first mirrored trace 815 is positioned in line with a corresponding concave edge 823 of the second mirrored trace 817. Similarly, each concave edge 825 of the second sub-trace of the first mirrored trace 815 is positioned in line with a corresponding convex edge 827 of the third mirrored trace 817. By staggering the mirrored traces, more mirrored traces can be fit in a given area.

Figure 9:
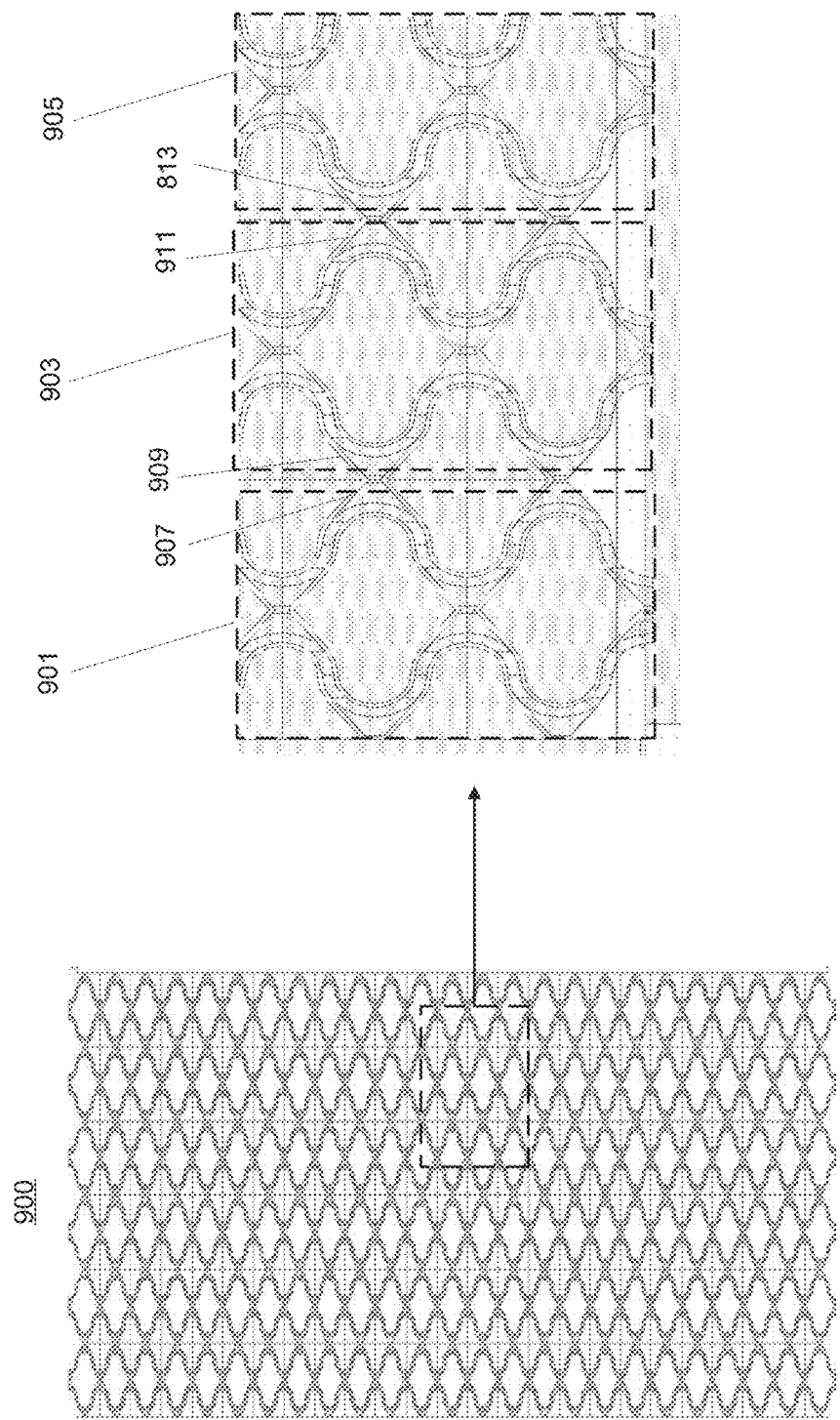
FIG. 9 is a view of mirrored conductive traces according to another embodiment.

In one embodiment, the mirrored traces split into additional number of sub-traces, creating a grid-like trace 900 in the bending area of the flexible display 100 as illustrated in FIG. 9. As an example, the sub-traces can be configured to form a web of mirrored traces 800 that resemble a grid 900. Such a trace design may be useful for traces that transmit a common signal, for example supply voltage signals, VSS and VDD, for the display 100. If one of the traces cracks due to bending, redundancy of the mirrored traces still allows for the transmission of the common signal. Neither the number of sub-traces nor the shape of the sub-traces forming the grid-like trace design are particularly limited to the example shown in FIG. 9. In some embodiments, the sub-traces may converge into a single trace past the bend allowance section of the flexible display 100.

As shown in FIG. 9, the grid-like trace 900 includes a first mirrored trace 901, a second mirrored trace 903, and a third mirrored trace 905, and so on. In one embodiment, each convex edge of a mirrored trace is connected to a corresponding convex edge of an adjacent mirrored trace. For example, in FIG. 9 each convex edge 907 of the right sub-trace of the first mirrored trace 901 is connected to a corresponding convex edge 909 of the left sub-trace of the second mirrored trace 903. Similarly, each convex edge 911 of the right sub-trace of the second mirrored trace 903 is connected to a corresponding convex edge 913 of a left sub-trace of the third mirrored trace 905.

The strain reducing trace designs discussed above may be used for all or parts of the conductive trace. In some embodiments, the part of conductive trace in the bend portion of the flexible display 100 may adopt such a strain reducing trace design. The parts of a conductive trace prior to or beyond the part with the strain reducing trace design may have the same trace design or a difference trace design. If desired, the strain reducing trace designs may be applied to multiple parts of a conductive trace.

Even with the strain reducing trace design, the inevitable bending stress remains at certain points of the trace (i.e., stress point). The location of stress point is largely dependent on the shape of the trace as well as the bending direction. It follows that, for a given bending direction, the trace of a wire and/or an insulation layer can be designed such that the remaining bending stress would concentrate at the desired parts of their trace, Accordingly, a crack resistance area can be provided in a trace design to reinforce the part of the wire trace where the bend stress concentrates.

While the embodiments herein are described with respect to a flexible display, other flexible electronic devices can use the various trace designs described above. For example, the embodiments herein may be incorporated in wearable electronic device that are designed to be flexed and worn on surfaces of the human body such as flexible electronic watches. Other examples in which the embodiments herein may be incorporated are mobile phones that are bendable, rolled displays for use in electronic tangible media such as electronic newspapers, magazines, and books. The embodiments herein may also be incorporated in flexible display screens of televisions. In addition, while the benefits of the embodiments herein are better realized in flexible electronic devices, the winding conductive traces according to the embodiments herein may be used any type of electronic devices including non-flexible electronics that employ a rigid substrate. These various aspects, embodiments, implementations or features of the described embodiments can be used separately or in any combination. The foregoing is merely illustrative of the principles of this invention and various modifications can be made by those skilled in the art without departing from the scope of the invention.

What is claimed is:

1. An apparatus comprising:
a flexible substrate; and
a winding conductive trace formed over the flexible substrate, the winding conductive trace including a plurality of alternating crests and troughs, each crest and each trough having a convex edge and a concave edge positioned opposite the convex edge;
wherein a first portion of the winding conductive trace located between each alternating crest and trough is smaller in width than a second portion of the winding conductive trace between the convex edge and concave edge of each of the crests and troughs, and
wherein the second portion of the winding conductive trace includes a cap comprising a metal trace, a width of the second portion including a width of the metal trace.

2. The apparatus of claim 1, wherein the length of the cap in a x-axis direction which is a horizontal direction decreases from the concave edge to the convex edge.

3. The apparatus of claim 1, wherein the second portion of the winding conductive trace between the convex edge and the concave edge of each of the crests and troughs further includes:
a first passivation layer having a first width; and
a second passivation layer having a second width that is substantially the same as the first width;
wherein the cap is formed between the first passivation layer and the second passivation layer and is enclosed by the first passivation layer and the second passivation layer.

4. The apparatus of claim 3, wherein the first width of the first passivation layer and the second width of the second passivation layer in the second portion of the winding conductive trace between the convex edge and the concave edge is larger than a third width of the metal trace included in the cap located between the convex edge and the concave edge.

5. The apparatus of claim 3, wherein the first portion of the winding conductive trace includes the first passivation layer, the second passivation layer, and the metal trace with a fourth width that is smaller than the third width, and wherein the first passivation layer, the second passivation layer, and the metal trace extend from the second portion of the winding conductive trace to the first portion.

6. The apparatus of claim 5, wherein the first passivation layer included in the first portion has a fifth width that is smaller than the first width of the first passivation layer in the second portion of the winding conductive trace between the convex edge and the concave edge, and the second passivation layer included in the first portion has a sixth width that is smaller than the second width of the second passivation layer in the second portion of the winding conductive trace between the convex edge and the concave edge, the sixth width substantially the same as the fifth width.

7. The apparatus of claim 6, wherein a width of the first portion is smaller than a width of the second portion of the winding conductive trace between the convex edge and the concave edge.

8. The apparatus of claim 1, wherein the cap is trapezoidal in shape and the shape is defined by the convex edge of the crest or trough in which the cap is located.

9. The apparatus of claim 1, wherein the cap is triangular in shape and the shape is defined by the convex edge of the crest or trough in which the cap is located.

10. The apparatus of claim 1, wherein the cap is rounded in shape and the shape is defined by the convex edge of the crest or trough in which the cap is located.

11. The apparatus of claim 1, wherein the concave edge is curved.

12. The apparatus of claim 1, wherein a distance from a convex edge of one of the crests to a convex edge of an adjacent one of the troughs is a height of the winding conductive trace and a distance from said one of the crests to an adjacent one of the crests is substantially the same as the height of the winding conductive trace.

13. The apparatus of claim 1, wherein a distance from a convex edge of one of the crests to a convex edge of an adjacent one of the troughs is a height of the winding conductive trace and a distance from said one of the crests to an adjacent one of the crests is within a range of a third of the height of the winding conductive trace to three times the height of the winding conductive trace.

14. The apparatus of claim 1, further comprising:
a cover layer formed over the winding conductive trace.

15. The apparatus of claim 1, wherein the flexible substrate is bent along a bend line and the winding conductive trace extends across the bend line.

16. The apparatus of claim 1, wherein the apparatus is a flexible television.

17. The apparatus of claim 1, wherein the apparatus is a wearable electronic device worn on a surface of a human body.

18. The apparatus of claim 1, wherein the apparatus is a mobile phone.

19. The apparatus of claim 1, wherein the apparatus is an electronic newspaper.

20. The apparatus of claim 1, wherein the apparatus is an electronic book.

* * * * *